United States Patent [19]

Wolfe

[11] 4,331,875

[45] May 25, 1982

[54] SHADOW CASTING ELECTRON-BEAM SYSTEM

[75] Inventor: John E. Wolfe, Julian, Calif.

[73] Assignee: Burroughs Corporation, Detroit, Mich.

[21] Appl. No.: 137,728

[22] Filed: Apr. 7, 1980

[51] Int. Cl.³ .................... G01K 1/08; H01J 37/00
[52] U.S. Cl. ............................... 250/398; 250/492.2
[58] Field of Search .................. 313/360, 361, 447; 250/311, 356 R, 396 ML, 398, 492 A

[56] References Cited

U.S. PATENT DOCUMENTS 4,140,913 2/1979 Anger et al. .................... 250/492 A
4,198,569 4/1980 Takayama .................... 250/396 ML Primary Examiner—Bruce C. Anderson
Attorney, Agent, or Firm—Charles J. Fassbender; J. Ronald Richbourg; Kevin R. Peterson

[57] ABSTRACT

Disclosed is an electron-beam system comprised of an iris having an aperture of predetermined shape; a cathode for emitting electrons from an area which is substantially smaller than the aperture; a lens system for directing the emitted electrons along a path through the aperture to form a magnified image of the aperture; and a target for the electrons which is placed along the path of the aperture's demagnified shadow.

9 Claims, 7 Drawing Figures

SHADOW CASTING ELECTRON-BEAM SYSTEM

BACKGROUND OF THE INVENTION

This invention relates to electron-beam machines as used in the fabrication of semiconductor circuits. Basically, in such machines, electrons are emitted from a cathode, accelerated by an electric field between the cathode and an anode, and directed by several lenses along a path to form an image of predetermined shape at a target. In the semiconductor industry, the image generally is a round or rectangular or square shaped spot, and the target is a layer of electron sensitive resist on a semiconductor substrate.

Typically, the spot is less than one micron across. The spot is moved to bombard only selected portions of the resist on the target. Those portions of a positive resist which are bombarded have their chemical properties changed such that they can thereafter be chemically removed from the substrate. But the unbombarded portions of a positive resist are insoluble in the chemical and thus remain as a mask for further processing of the substrate.

One electron-beam lithography system which is typical of those used in the prior art is illustrated in FIG. 1. In that figure, reference numeral 10 indicates the cathode. Electrons from the cathode are accelerated by an anode (not shown) through the aperture 11 of an iris 12. Reference numerals 13a, 13b, 14a, 14b, 15a, and 15b indicate various paths by which some of the electrons from cathode 10 pass through aperture 11.

In order to form a demagnified image of aperture 11, the system of FIG. 1 includes a lens 16. For illustrative purposes, lens 16 as well as all other lenses in this case, are drawn as optical lenses; but they actually are electro-magnetic lenses. Electrons on paths 14a and 14b pass through the center of lens 16, and thus they emerge from that lens along undeflected paths 17a and 17b. But electrons along paths 13a and 13b are deflected due to the operation of lens 16 along paths 18a and 18b, respectively.

Reference numeral 19 indicates the demagnified image of aperture 11 which is formed by lens 16. Its location is determined by the intersection of paths 17a and 18a, and the intersection of paths 17b and 18b. By inspection of those paths, it can be seen that the amount by which image 19 is demagnified is dependent upon the angle by which lens 16 bends paths 18a and 18b. A greater bend results in more demagnification.

Unfortunately, due to various technological limitations, the most demagnification which is realistically feasible is approximately 1/10th. Stronger lenses are not feasible because they are limited by magnetic saturation or overheating due to the large number of ampere-turns which would be required. At the same time however, aperture 11 must generally be about 300 micrometers across. Any smaller aperture will reduce the number of electrons that pass through it which reduces current at the target below an acceptable level.

Thus, to obtain an image of aperture 11 which is less than one micrometer across, additional lenses must be provided. These are indicated by reference numerals 20 and 21. Lens 20 forms a reduced image 22 of image 19; and lens 21 forms a reduced image 23 of image 22. Reference numerals 24a–26b indicate some of the electron paths from image 19 which form image 22; and reference numerals 27a–29b indicate some of the electron paths from image 22 which form image 23. With this system, image 23 can typically be made to be one-half micron across.

However, an undesirable aspect of the FIG. 1 electron-beam system is that it requires too many lenses for its operation. Each lens adds to the cost of the system. Also, the entire path over which electrons pass through the lenses must be encapsulated in a vacuum column; and the cost of the system increases with the length of that column.

Another problem with the FIG. 1 system is that the percentage of electrons from cathode 10 which actually hit the target is too low. More than 50% of the electrons which are emitted by cathode 10 are blocked by plates 30, 31, and 32 which respectively surround lenses 16, 20, and 21. See for example, the electrons which pass along paths 15a, 15b, 26a, 26b, 29a, and 29b. Electrons on those paths could only be captured by increasing the size of each lens; but that in turn would reduce the lenses demagnifying power and consequently even more lenses would have to be added to the system.

Still other problems occur in the FIG. 1 system due to the crowding of electrons which occurs at the point where various paths cross over one another. This crowding of electrons occurs at the point where paths 26a and 26b cross, at the point where paths 29a and 29b cross, and at the cross over point just before the formation of image 23. Due to this crowding, the electrons are repelled from each other by coulomb forces. The forces occur in both the horizontal direction and vertical directions, and the effect is to make the image 23 at the target less sharp.

Further, in the electron-beam system of FIG. 1, cathode 10 should be at least as large as aperture 11. This insures that some electrons will travel along paths 13a, 13b, 14a, and 14b and thus form image 19 of aperture 11. However, only thermionic cathodes can be made at least as large as aperture 11, which typically is 300 micrometers across. But a problem with thermionic cathodes is that their emission is relatively low (i.e., 10–25 amps per centimeter squared), and their operating lifetime is also relatively low (i.e., 100 hours) at these current densities.

Accordingly, a primary object of the invention is to provide an improved electron-beam lithography system.

Another object of the invention is to provide an electron-beam system having a reduced number of components.

Another object of the invention is to provide an electron-beam system having a high percentage of emitted electrons which actually reach the target.

Another object of the invention is to provide an electron-beam system wherein distortion at the target caused by electron crowding in their path to the target is reduced.

Still another object of the invention is to provide an electron-beam system having increased current density at the target and increased lifetime.

BRIEF SUMMARY OF THE INVENTION

These and other objectives are accomplished by an electron-beam system having an iris with an aperture of predetermined shape; a cathode for emitting electrons from an area which is substantially smaller than the aperture; a lens system for directing the emitted electrons along a path through the aperture to form a magnified image of the aperture; and a target for the electrons which is placed along the path in the aperture's demagnified shadow.

In this electron-beam system, a reduced number of lenses are required over the prior art. Also, a substantially higher percentage of those electrons which are emitted from the cathode actually hit the target. Further, distortion of the electron-beam pattern at the target due to electrons crowding together as they travel to the target is reduced. In addition, the size of the electron-beam at the target can be readily varied in real time from one magnitude to another simply by changing the focal length of one lens.

BRIEF DESCRIPTION OF THE DRAWINGS

Various features and advantages of the invention will best be understood by reference to the following detailed description and accompanying drawings wherein.

DETAILED DESCRIPTION

Figure 1:
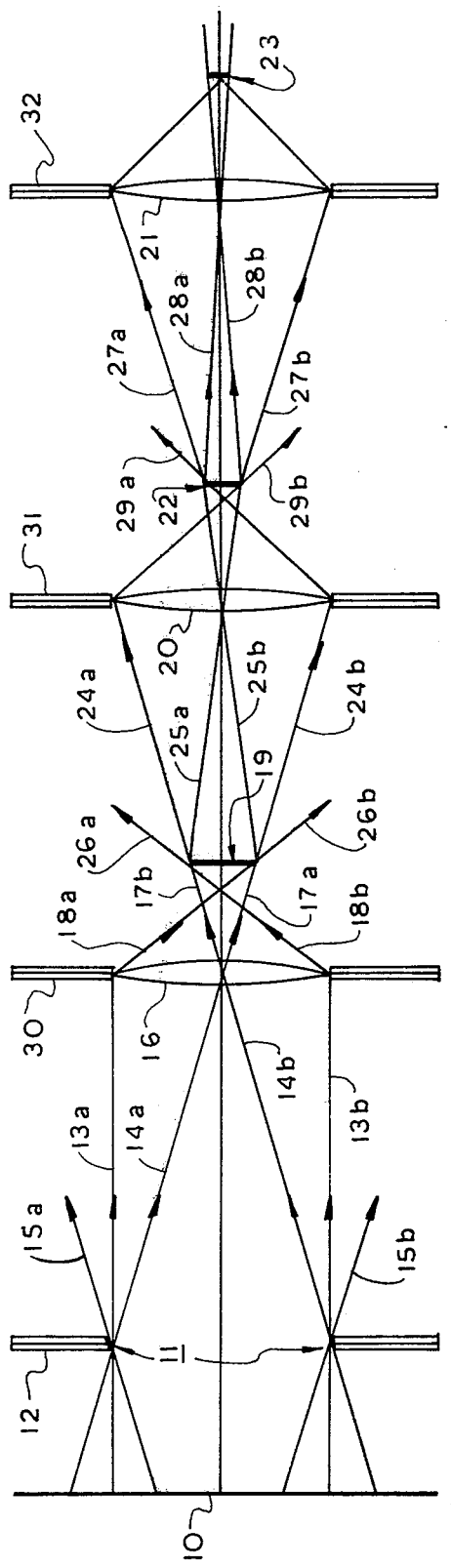
FIG. 1 is a schematic diagram of a prior art electron-beam lithography system.
Figure 2:
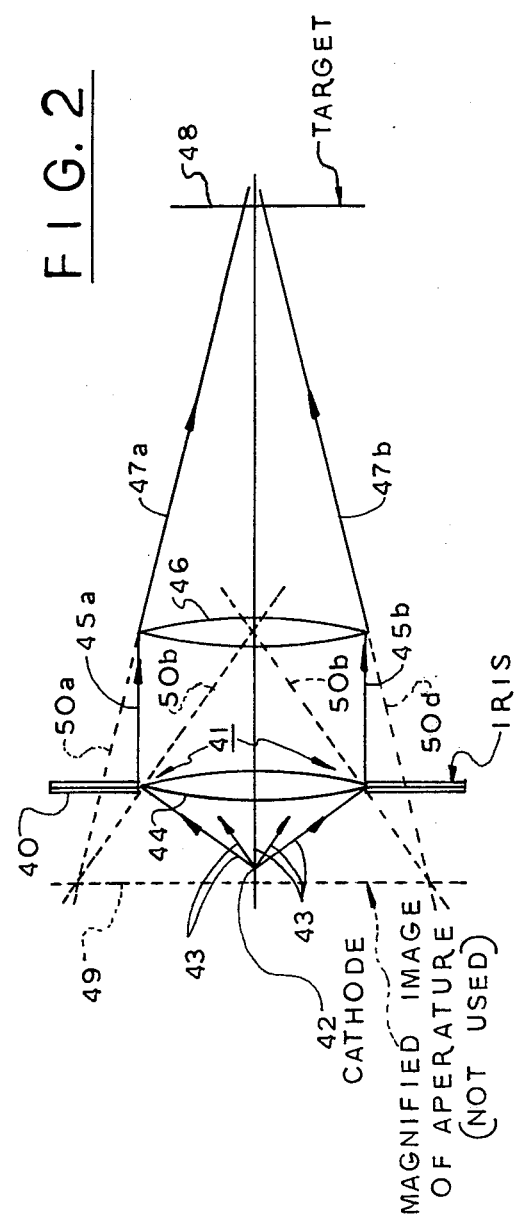
FIG. 2 is a schematic diagram of one embodiment of an electron-beam lithography system constructed according to the invention.

Referring now to FIG. 2, the details of an electron-beam lithography system which is constructed according to the invention will be described. This system includes an iris 40 having an aperture 41 whose shape is patterned on a target. Suitably, aperture 41 is approximately 300 micrometers across.

Positioned in front of aperture 41 is a cathode 42. Preferably, cathode 42 is less than one-ten thousandth of the size of aperture 41. This may be achieved by making aperture 42 a field emission cathode. Such cathodes have a virtual emitting surface of only approximately 200 Å in diameter as will be described in greater detail in conjunction with FIG. 4a.

Electrons from cathode 42 are accelerated by an anode (not shown) along various paths 43 through aperture 41. A lens 44 is provided to collimate the electrons as they pass through the aperture. Reference numerals 45a and 45b indicate two paths which electrons travel as they pass through lens 44 at the edge of aperture 41. A second lens 46 is provided to converge the electrons which have passed through lens 44. Due to the operation of lens 46, electrons along paths 45a and 45b are deflected along paths 47a and 47b, respectively.

Reference numeral 48 indicates the target in the FIG. 2 system. By inspection, it can be seen that target 48 is not positioned at the location of the image of aperture 41; but instead is placed in the shadow of aperture 41. Reference numeral 49 indicates the location of the aperture image. It is an enlarged virtual image, which can be verified by tracing electron paths 50a, 50b, 50c, and 50d.

Figure 3:
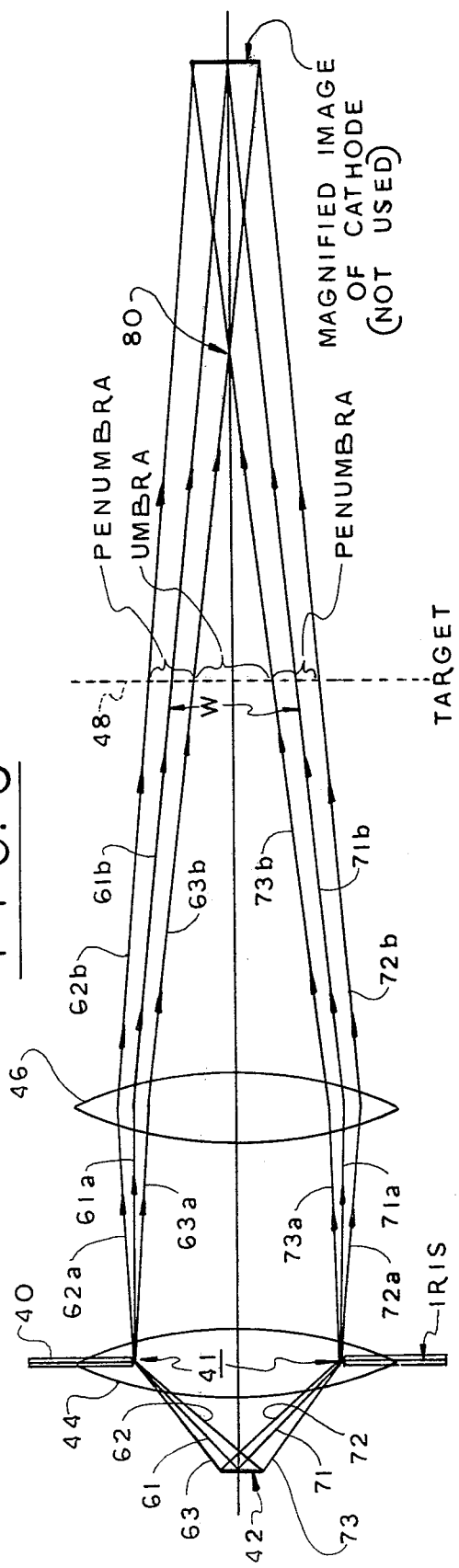
FIG. 3 is a schematic diagram illustrating in greater detail the operation of the electron-beam lithography system of FIG. 2.

Reference should now be made to FIG. 3, which illustrates the operation of the FIG. 2 system in greater detail. In FIG. 3, reference numerals 40, 41, 42, 44, 46, and 48 all indicate portions of the system as described above. But in addition, the relative size of cathode 42 as illustrated is exaggerated. This is useful in explaining the nature of the shadow of aperture 41 which is cast upon target 48.

Consider first the effect of lens 44 on electrons which pass along a path 61. That path starts from the center of cathode 42 and goes to the perimeter of aperture 41. Lens 44 deflects electrons from path 61 to another path 61a which is parallel to the axis of the lens. Other electrons which travel along paths 71 and 71a also behave in a similar manner due to the system's symmetry.

Next, consider the effect of lens 44 on electrons which travel along a path 62. That path starts at the bottom of cathode 42 and ends at the perimeter of aperture 41. Electrons which travel along path 62 leave lens 44 along a path 62a. Again by symmetry, electrons which travel along a similar path 72 leave lens 44 along a path 72a which diverges from the axis of lens 44 by the same angle as path 62a.

That angle of divergence may be determined by considering the fact that cathode 42 is thousands of times smaller than aperture 41. As described above, cathode 42 has a virtual diameter of approximately only 200 Å, whereas aperture 41 is approximately 300 micrometers across or $300 \times 10^4$ Å. Thus, the angle between paths 61 and 61a is essentially the same as the angle between paths 62 and 62a. That angle is also the same as the angle between paths 71 and 71a, and between paths 72 and 72a.

Two other electron paths from cathode 42 which need to be considered are indicated by reference numerals 63 and 73. Electrons on those paths emerge from lens 44 along path 63a and 73a. Based on the above described rationale, the angle between paths 63 and 63a, and between paths 73 and 73a, is the same as the angle between paths 61 and 61a.

Lens 46 operates to converge all of the electrons which pass through lens 44. That is, there is no loss of electrons between the two lens. As a result, very high current densities, such as 1000 Amps/cm$^2$, can be obtained at target 48. In FIG. 3, reference numerals 61b, 62b, 63b, 71b, 72b, and 73b indicate the electron paths emerging from lens 46 which respectively correspond to the entering electron paths 61a, 62a, 63a, 71a, 72a, and 73a.

By inspection of FIG. 3, it can be seen that as the size of cathode 42 is reduced, paths 61, 62, and 63 merge closer together; and therefore the corresponding electron paths 61a, 62a, and 63a also merge closer together. If FIG. 3 were drawn to scale, cathode 42 would be at least ten thousand times smaller than aperture 41, and therefore the electron paths 61a, 62a, and 63a would be essentially on top of each other. Thus, since electrons along paths 61a, 62a, and 63a all enter lens 46 at substantially the same point, they are deflected by the same angle.

Consider now the location of target 48. That target can be placed anywhere between lens 46 and the crossover point of electron paths 63b and 73b, which is indicated by reference numeral 80. The exact location of target 48 between those two points in combination with the strength of lens 46 determines the size and sharpness of the shadow of aperture 41 on the target. With the location of target 48 fixed, the size of the shadow can be adjusted to a desired value by simply varying the strength of lens 46. This is done in real time by simply varying the current through the lens' magnetic coils.

Electrons which hit target 48 between paths 63b and 73b lie in the umbra portion of the shadow. By comparison, electrons which hit target 48 between paths 62b and 63b, and between paths 72b and 73b lie in the penumbra portion of the shadow. From the preceding analysis, it can be seen that the penumbra portion of the shadow on target 48 decreases as the size of cathode 42 decreases relative to the virtual size of aperture 41.

Figure 4A:
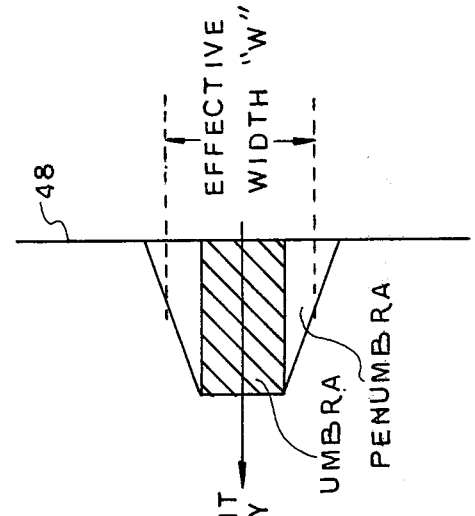
FIG. 4a is a greatly enlarged cross-sectional view of the cathode in FIG. 3.

FIG. 4a illustrates how the virtual size of cathode 42 is determined. In zirconiated tungsten field emission cathodes, the size of the (100) surface 42a from which electrons are actually emitted is approximately 1 micrometer in diameter. However, the half angle at which electrons leave surface 42a and pass through aperture 41 lies between approximately only ±0.028 radians. Thus, by tracing electron paths back into the bulk of cathode 42, it appears that all electrons are being emitted from a virtual source 42b which lies approximately 1 micrometer beneath surface 42a and is only approximately 200 Å in diameter.

Figure 4B:
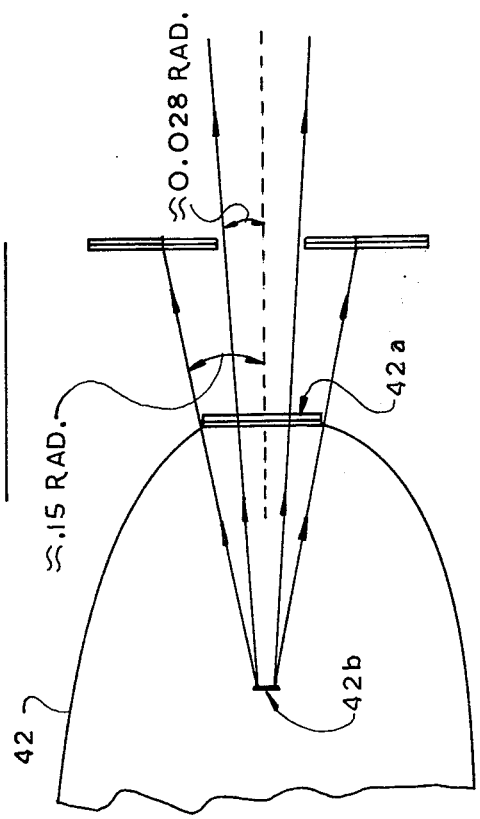
FIG. 4b is a diagram illustrating the approximate current density at the target in the electron-beam lithography system of FIG. 3.

In the umbra region at the target, current density is essentially uniform; whereas in the penumbra regions, current density decreases to zero. The width of each of these regions as illustrated in FIG. 4b corresponds to a target located as illustrated in FIG. 3. As a rough approximation, the width of the shadow equals the distance between midpoints in the penumbra regions. This is because lower current densities have little or no effect on the solubility of electron sensitive resist.

From the geometry of FIG. 4b, it can be seen that approximately 3/5 of the shadow at the target is umbra. That umbra has a penumbra around its perimeter which is 1/5 as large. Thus with the effective width set at one-half micron, one could roughly expect a 3,000 Å umbra surrounded by 1,000 Å of penumbra.

A much more precise analysis of the shadow's makeup at target 48 was carried out using a computer. In that analysis, the computer tracked electrons along their paths through lenses 44 and 46 to target 48, and printed out the number of electrons which hit the target at various points. That printout is illustrated in FIG. 5.

Figure 5:
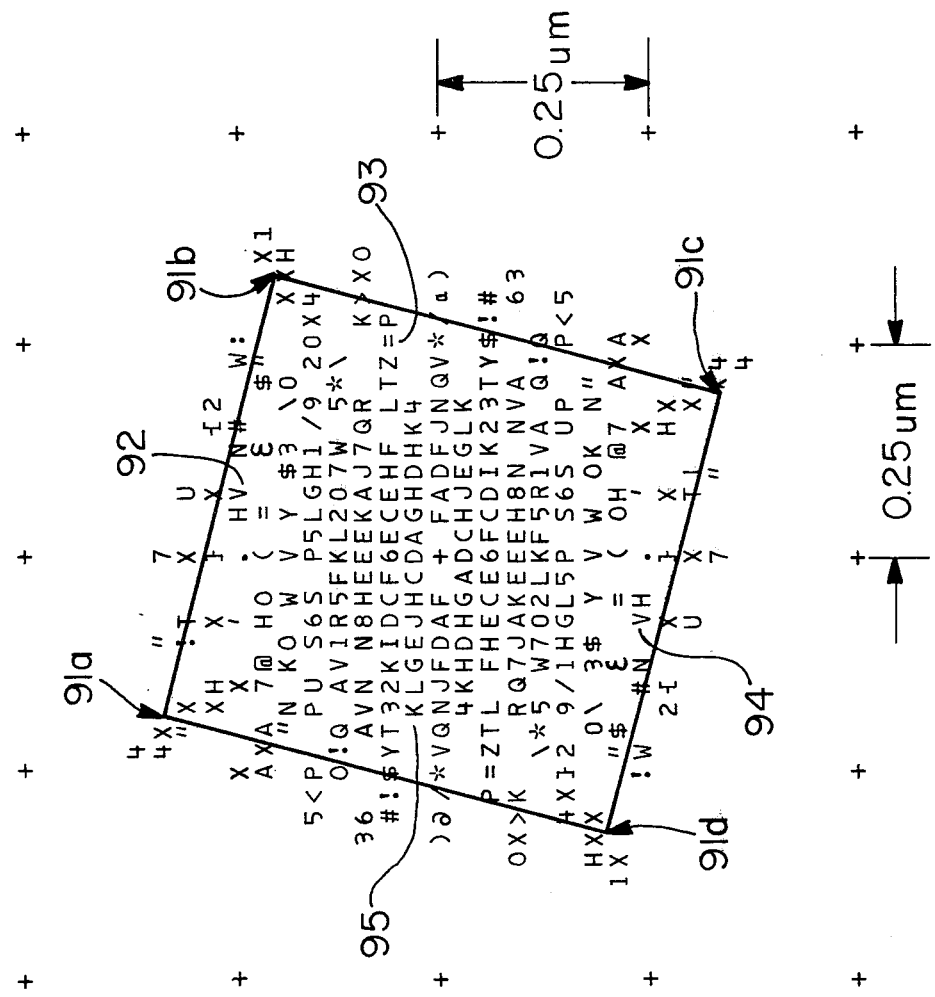
FIG. 5 is a computer printout illustrating the relative number of electrons which hit various points of the target in the electron-beam system of FIG. 3.

In obtaining the FIG. 5 printout, lens 44 had a focal length of 0.2 inches, a strength of 2,000 ampere-turn$^2$ per acceleration volt, and an inside diameter of 1.0 inch. Lens 46 had a focal length of 1.5 inches, a strength of 200 ampere-turn$^2$ per acceleration volt, and an inside diameter of 4.0 inches. Cathode 42 was placed at the focal point of lens 44; lenses 44 and 46 were spaced apart by 5 inches; and target 48 was placed 65 microns in front of the focal point of lens 46. The accelerating potential from the cathode to the anode was 10,000 volts; aperture 41 had a square shape of 150 micrometers on an edge, and electrons left cathode 42 with initial energies of from 0 to 2 electron volts.

Various characters are used in FIG. 5 to indicate the relative number of electrons which hit the target where the character is plotted. Number "1" represents the minimal relative number of electrons, and letter "X" represents the maximum relative number of electrons which is 58 times greater than "1". All other relative magnitudes which lie between these extremes are indicated below in table 1.

TABLE 1

| 1 = 1 | B = 11 | L = 21 | V = 31 | # = 41 | $ = 51 |

TABLE 1-continued

| 2 = 2 | C = 12 | M = 22 | W = 32 | / = 42 | [ = 52 |
| 3 = 3 | D = 13 | N = 23 | Y = 33 | = 43 | ] = 53 |
| 4 = 4 | E = 14 | O = 24 | Z = 34 | ! = 44 | = 54 |
| 5 = 5 | F = 15 | P = 25 | - = 35 | . = 45 | = 55 |
| 6 = 6 | G = 16 | Q = 26 | * = 36 | , = 46 | ? = 56 |
| 7 = 7 | H = 17 | R = 27 | ( = 37 | @ = 47 | % = 57 |
| 8 = 8 | I = 18 | S = 28 | ) = 38 | " = 48 | X = 58 |
| 9 = 9 | J = 19 | T = 29 | $ = 39 | " = 49 | |
| A = 10 | K = 20 | U = 30 | = = 40 | ' = 50 | |

A determination of where the umbra and penumbra regions lie in FIG. 5, can be made by first locating the points where the maximum number of electrons hit. These points are defined by the "X" character, and their location is indicated by reference numerals 91a–91d. Next consider the four straight lines 92–95 which interconnect the above points. Essentially all of the characters which lie along those lines indicate a relatively high number of electrons. Also, very few characters lie outside of those lines, which indicates a sharply defined square shadow.

Also by inspection of FIG. 5, it can be seen that the relative number of electrons increases from the center of the square to the perimeter. This is desirable because it gives a uniform current density throughout the square. Current density at any particular point in the square is proportional to the number of electrons through that point divided by the distance from the squares center to that point.

Figure 6:
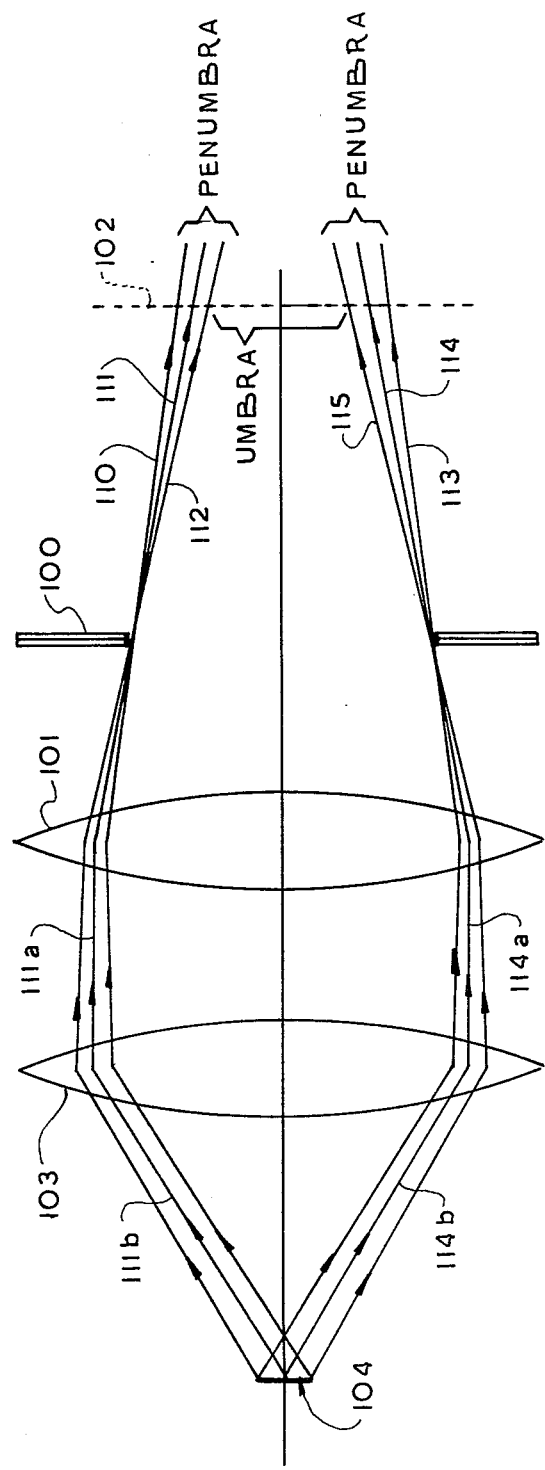
FIG. 6 is a schematic diagram of a second embodiment of the invention.

Referring now to FIG. 6, a second embodiment of the invention will be described. This embodiment is substantially similar to the embodiment described above, the primary difference being in the location of the iris which defines the shape of the shadow at the target. In particular, the iris of FIG. 6, which is indicated by reference numeral 100, is located between a converging lens 101 and a target 102. As before, another converging lens 103 is provided to collimate electrons from a cathode 104.

All of the components 100–104 are similar in construction and size to their counterparts as described above. Thus, since cathode 104 is approximately 10,000 times smaller than the aperture in iris 100, the same approximations which were made in tracing electron paths in FIG. 3 apply here. Those electron paths which emanate from the perimeter of the aperture in iris 100 are indicated by reference numerals 100–115.

Electron paths 111 and 113 enter lens 101 from lens 103 along paths which are parallel to the lenses axes. These paths are indicated by reference numerals 111a and 114a. The angle between paths 111 and 111a is essentially the same angle by which electrons on path 110, 112, 114, and 115 are deflected by lens 101.

Similarly, electrons which exit lens 103 along paths 111a and 114a enter that lens along paths 111b and 114b. Those paths pass through the center of cathode 104. An angle is formed between electron paths 111a and 111b; and that angle is essentially the same angle by which lens 103 deflects electrons on the other illustrated paths.

By inspection of these electron paths it can be seen that the relative size of the umbra and penumbra regions at target 102 are substantially the same as the relative size of those regions in the FIG. 3 embodiment. This has been verified by computer calculation. Thus, the location of iris 100 is essentially a matter of design choice.

Various preferred embodiments of the invention have now been described in detail. In addition, many changes and modifications can be made to these details without departing from the nature and spirit of the invention. For example, iris 100 could be placed either in front of lens 103, or between lenses 101 and 103. As another example, the strength of lens 46 in the FIG. 3 embodiment could be decreased to form an enlarged real image of aperture 41. But again, that image would not be used, and target 48 would still be placed between lens 46 and cross-over point 80.

Therefore, it is to be understood that the invention is not limited to said details but as defined by the appended claims.

What is claimed is:

1. An electron-beam system comprised of:
    an iris having an aperture of predetermined shape;
    means for emitting electrons from an area which is substantially smaller than said predetermined shape;
    means for forming a magnified image and a demagnified shadow of said aperture with said emitted electrons along a path through said aperture; and
    means for placing a target along said path in the demagnified shadow of said aperture.

2. An electron-beam system according to claim 1 wherein said aperture of said iris is square.

3. An electron-beam system according to claim 1 wherein said electrons are emitted from a virtual area which is less than one-ten thousandth times the area of said aperture.

4. An electron-beam system according to claim 1 wherein said magnified image is virtual.

5. An electron-beam system according to claim 1 wherein said magnified image is real.

6. An electron-beam system according to claim 1 wherein said means for forming a magnified image and a demagnified shadow includes a first lens aligned along said path for collimating electrons from said means for emitting, and includes a second lens aligned along said path for converging electrons from said first lens.

7. An electron-beam system according to claim 6 wherein said aperture lies along said path between said means for emitting and said first lens.

8. An electron-beam system according to claim 6 wherein said aperture lies along said path after said second lens.

9. A method of performing electron-beam lithography including the steps of:
    providing an iris with an aperture of predetermined shape;
    emitting electrons from an area which is substantially smaller than said predetermined shape;
    forming a magnified image and a demagnified shadow of said aperture with said emitted electrons along a path through said aperture; and
    placing a target along said path in the demagnified shadow of said aperture.

* * * * *